US010090440B1

(12) United States Patent
Liu et al.

(10) Patent No.: US 10,090,440 B1
(45) Date of Patent: Oct. 2, 2018

(54) LIGHT-EMITTING DEVICE AND METHOD OF MANUFACTURING THEREOF

(71) Applicant: EPISTAR CORPORATION, Hsinchu (TW)

(72) Inventors: Victor Liu, Hsinchu (TW); De-Shan Kuo, Hsinchu (TW); Hsin-Ying Wang, Hsinchu (TW); Chun-Hsiang Tu, Hsinchu (TW); Yu-Ting Huang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/588,166

(22) Filed: May 5, 2017

(51) Int. Cl.
*H01L 29/207* (2006.01)
*H01L 33/38* (2010.01)
*H01L 33/14* (2010.01)
*H01L 33/20* (2010.01)

(52) U.S. Cl.
CPC .......... *H01L 33/387* (2013.01); *H01L 33/145* (2013.01); *H01L 33/20* (2013.01)

(58) Field of Classification Search
CPC ......... H01L 33/08; H01L 33/20; H01L 33/38; H01L 33/387; H01L 27/153; H01L 27/156; H01L 33/145
USPC ...................................................... 257/93, 99
See application file for complete search history.

(56) References Cited

U.S. PATENT DOCUMENTS

| | | | | |
|---|---|---|---|---|
| 6,547,249 B2 * | 4/2003 | Collins, III | H01L 27/153 | 257/88 |
| 2006/0060888 A1 * | 3/2006 | Kim | H01L 21/02378 | 257/200 |
| 2006/0157717 A1 * | 7/2006 | Nagai | H01L 33/025 | 257/81 |
| 2013/0292718 A1 * | 11/2013 | Chu | H01L 27/153 | 257/93 |
| 2014/0070258 A1 | 3/2014 | Chen et al. | | |
| 2017/0040515 A1 * | 2/2017 | Lee | H01L 33/62 | |

FOREIGN PATENT DOCUMENTS

WO 2014061971 A1 4/2014

* cited by examiner

*Primary Examiner* — Jami M Valentine
(74) *Attorney, Agent, or Firm* — Ditthavong & Steiner, P.C.

(57) ABSTRACT

A light-emitting device is provided. The light-emitting device comprises a substrate; a semiconductor stack on the substrate comprising a first region and a second region; a first trench extending from the semiconductor stack to the substrate to expose a surface of the substrate and separating the first region from the second region; and a first electrode comprising a first pad on the first region and a first extending electrode connecting to the first pad, wherein the first extending electrode is across the first trench.

20 Claims, 11 Drawing Sheets

LIGHT-EMITTING DEVICE AND METHOD OF MANUFACTURING THEREOF

TECHNICAL FIELD

The present disclosure relates to a light-emitting device, and more particularly to a light-emitting device comprising a trench.

DESCRIPTION OF BACKGROUND ART

Light-emitting diode (LED) is a solid state semiconductor device and generally comprises a p-type semiconductor layer, an n-type semiconductor layer, and an active layer formed between the p-type semiconductor layer and the n-type semiconductor layer for emitting light under the principle of transforming electrical energy to optical energy by injecting electrons and holes through the n-type semiconductor layer and the p-type semiconductor layer respectively to the active layer to perform radiative combination and emit light.

SUMMARY OF THE DISCLOSURE

The present disclosure provides a light-emitting device comprises a substrate; a semiconductor stack on the substrate comprising a first region and a second region; a first trench extending from the semiconductor stack to the substrate to expose a surface of the substrate and separating the first region from the second region; and a first electrode comprising a first pad on the first region and a first extending electrode connecting to the first pad, wherein the first extending electrode is across the first trench.

DETAILED DESCRIPTION OF THE PRESENT DISCLOSURE

Figure 1A:
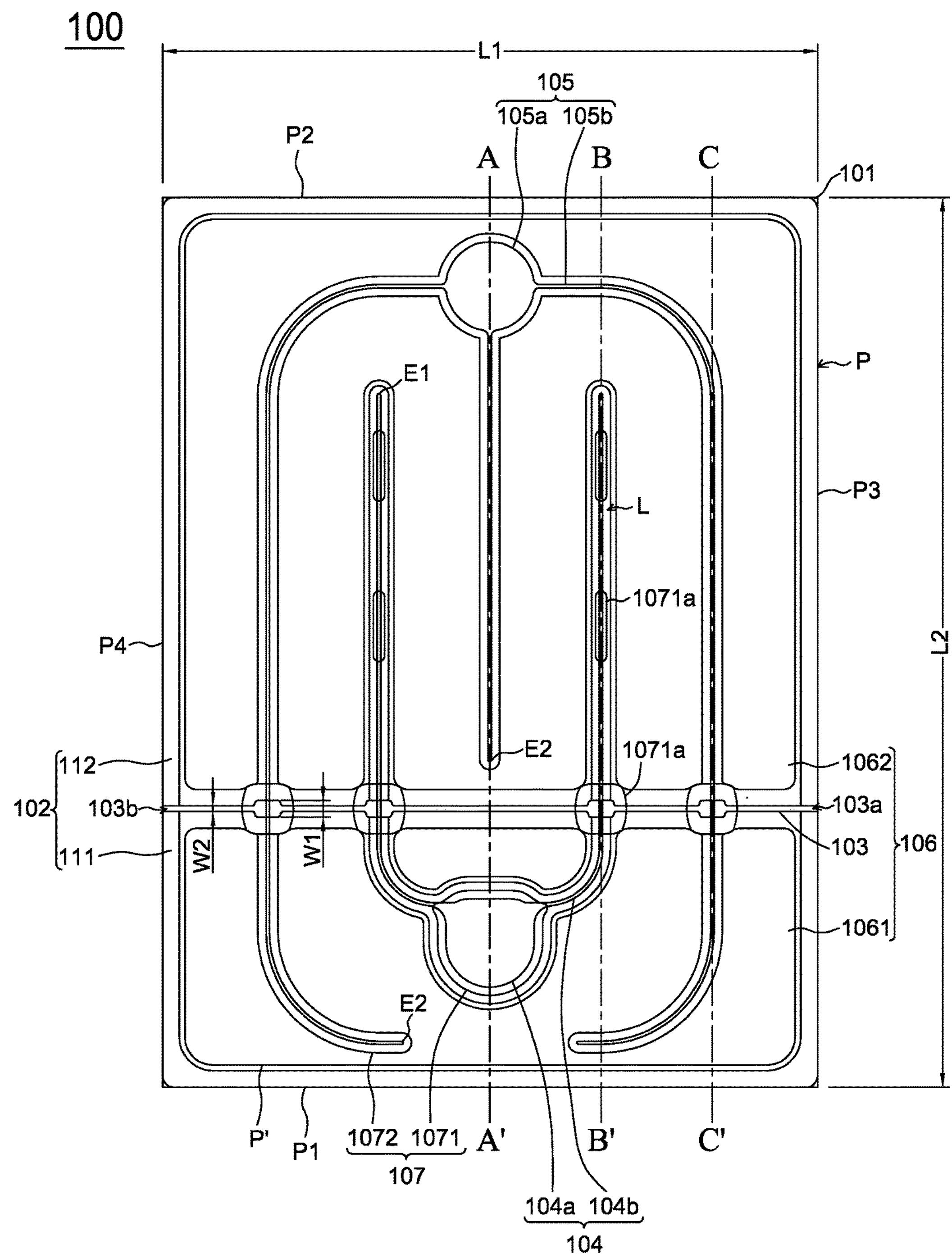
FIG. 1A shows a schematic top view of a light-emitting device in accordance with a first embodiment of the present disclosure.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precisely scaled and components may be exaggerated in view of width, height, length, etc. Herein, the similar or identical reference numerals will denote the similar or identical components throughout the drawings.

In the present disclosure, if not specifically mention, the general expression of AlGaAs means $Al_xGa_{(1-x)}As$, wherein $0 \leq x \leq 1$; the general expression of AlInP means $Al_xIn_{(1-x)}P$, wherein $0 \leq x \leq 1$; the general expression of AlGaN means $Al_xGa_{(1-x)}N$, wherein $0 \leq x \leq 1$; the general expression of AlGaInP means $(Al_yGa_{(1-y)})_{1-x}In_xP$, wherein $0 \leq x \leq 1$, $0 \leq y \leq 1$; the general expression of AlGaInN means $(Al_yGa_{(1-y)})_{1-x}In_xN$, wherein $0 \leq x \leq 1$, $0 \leq y \leq 1$; the general expression of AlGaN means $Al_xGa_{(1-x)}N$, wherein $0 \leq x \leq 1$; the general expression of AlAsSb means $AlAs_{(1-x)}Sb_x$ wherein $0 \leq x \leq 1$ and the general expression of InGaP means $In_xGa_{1-x}P$, wherein $0 \leq x \leq 1$; the general expression of InGaN means $In_xGa_{1-x}N$ wherein $0 \leq x \leq 1$. The content of the element can be adjusted for different purposes, such as, but not limited to, adjusting the energy gap or adjusting the peak wavelength or the dominant wavelength.

Figure 1B:
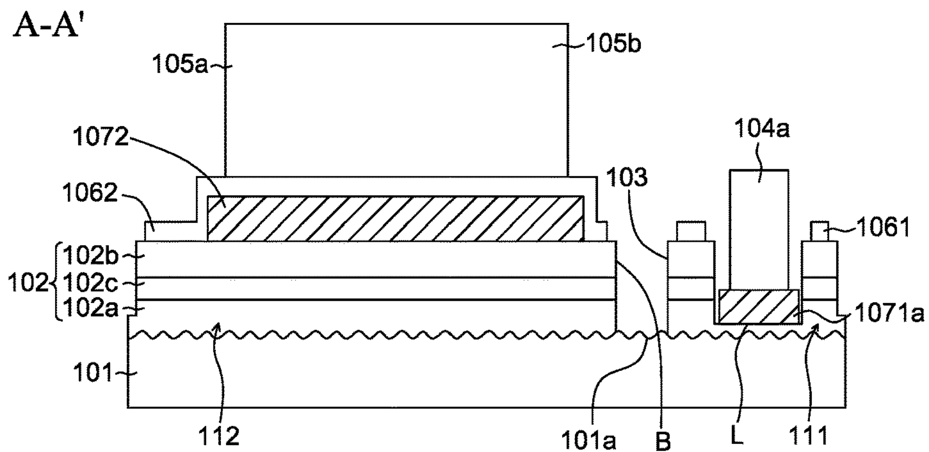
FIG. 1B shows a schematic cross-section view of the light-emitting device along the line A-A' shown in FIG. 1A.
Figure 1C:
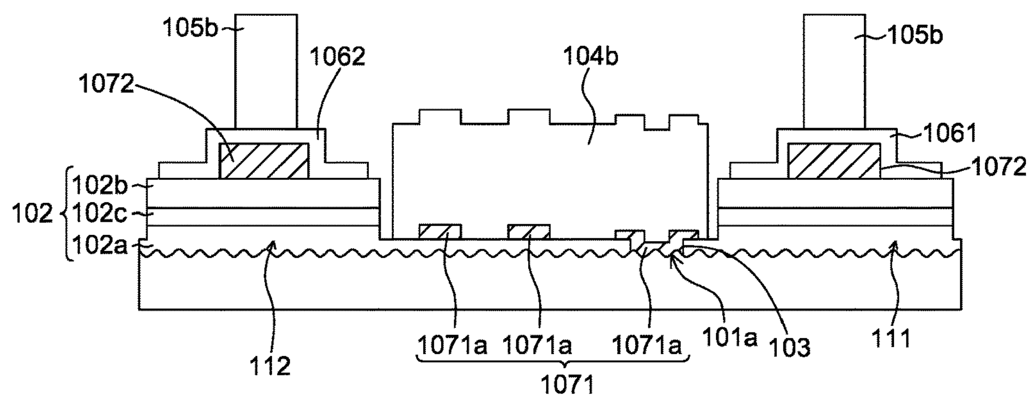
FIG. 1C shows a schematic cross-section view of the light-emitting device along the line B-B' shown in FIG. 1A.
Figure 1D:
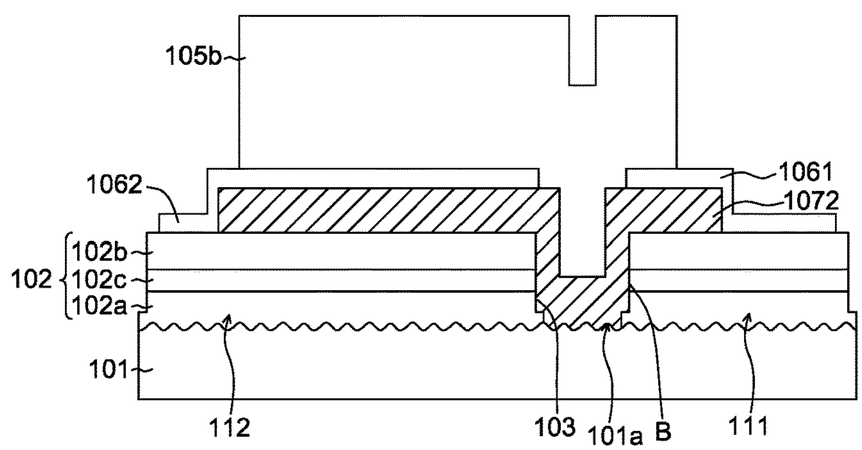
FIG. 1D shows a schematic cross-section view of the light-emitting device along the line C-C' shown in FIG. 1A.

FIG. 1A shows a top view of a light-emitting device (LED) 100 in accordance with a first embodiment of the present disclosure. FIGS. 1B-1D show cross-section views of the LED 100 along the lines A-A', B-B', and C-C' in FIG. 1A respectively. The LED 100 comprises a semiconductor stack 102, a first trench 103, and a first electrode 104. The first trench 103 divides the semiconductor stack 102 into a first region 111 and a second region 112 different from the first region 111. The first electrode 104 may be deposited on the first region 111 or the second region 112 of the semiconductor stack 102. The first electrode 104 is across the first trench 103 to electrically connect the first region 111 and the second region 112 of the semiconductor stack 102. The LED 100 further comprises a substrate 101, and the semiconductor stack 102 can be located on the substrate 101. The LED 100 further comprises a second electrode 105 electrically connects to the semiconductor stack 102. The first trench 103 extends from the semiconductor stack 102 to the substrate 101 to expose a top surface 101*a* of the substrate 101. In other words, the first trench 103 physically separates the first region 111 from the second region 112. However, in another embodiment, the first trench 103 may be devoid of extending to the top surface 101*a* of the substrate 101, and the first region 111 and the second region 112 may physically connect to each other by a part of the semiconductor stack 102 under the first trench 103.

The substrate 101 can serve as a support to prevent the semiconductor stack 102 of the LED 100 from breaking during the manufacturing process or the usage of LED 100.

The substrate 101 is not limited to single-crystal substrate, it can be poly-crystal or amorphous substrate as well. A material of the substrate 101 may comprise sapphire, glass, ceramic, Si, GaN, GaP, GaAs, GaAsP, ZnSe, ZnS, InP, SiC, aluminum (Al), copper (Cu), gold (Au), silver (Ag), molybdenum (Mo), or combinations thereof. In an embodiment of the present disclosure, the substrate 101 can be a growth substrate for growing the semiconductor stack 102, such as gallium arsenide (GaAs) substrate, sapphire ($Al_2O_3$) substrate, gallium nitride (GaN) substrate or silicon carbide (SiC) substrate. The semiconductor stack 102 can be directly grown on the substrate 101 by epitaxy growth method, such as metallic-organic chemical vapor deposition (MOCVD) method, molecular beam epitaxy (MBE) method, physical vapor deposition (PVD), hydride vapor phase epitaxy (HVPE) method, or ion plating, such as sputtering or evaporation. Furthermore, to reduce the total internal reflection (TIR) between the substrate 101 and the semiconductor stack 102 and improve the light-extraction efficiency, the top surface 101*a* of the substrate 101 may have a rough surface where the semiconductor stack 102 is deposited on. In another embodiment of the present disclosure, the semiconductor stack 102 can be firstly grown on a growth substrate and then transferred to the substrate 101.

As shown in FIGS. 1B-1D, the semiconductor stack 102 comprises a first type semiconductor layer 102*a* on the substrate 101, a second type semiconductor layer 102*b* on the first type semiconductor layer 102*a*, and an active layer 102*c* between the first type semiconductor layer 102*a* and the second type semiconductor layer 102*b*. As shown in FIGS. 1A and 1B, the semiconductor stack 102 has a recess L where exposes a part of the first type semiconductor layer 102*a*. The material of the semiconductor stack 102 may include a III-V semiconductor material, such as AlGaInN or AlGaInP. The active layer 102*c* comprises a structure selected from a group consisting of homostructure, single heterostructure (SH), double heterostructure (DH), a double-side double heterostructure (DDH), and multiple quantum wells (MQW). The material of the active layer 102*c* may comprise i-type, p-type, or n-type semiconductor. The first type semiconductor layer 102*a* may have a conductivity type different from the second type semiconductor layer 102*b*. For example, the first type semiconductor layer 102*a* may be n-type and the second type semiconductor layer 102*b* may be p-type, or the first type semiconductor layer 102*a* may be p-type and the second type semiconductor layer 102*b* may be n-type. In one embodiment, the material of the first type semiconductor layer 102*a* and the second type semiconductor layer 102*b* may comprise n-type gallium nitride (GaN) and p-type GaN respectively. Moreover, the LED 100 may comprise a buffer structure (not shown) between the semiconductor stack 102 and the substrate 101, and the buffer structure may be used to relieve stress caused by lattice mismatch between the substrate 101 and the semiconductor stack 102. The buffer structure may comprise a nitride based material layer, such as gallium nitride, aluminum nitride, or aluminum gallium nitride. The buffer structure can be a single layer or multiple layers. The buffer structure can be formed by metal organic chemical vapor deposition (MOCVD), molecular beam epitaxy (MBE) or physical vapor deposition (PVD). The PVD method includes a sputtering method, for example, reactive sputtering method or an evaporation method, such as e-beam evaporation method or thermal evaporation method. In one embodiment the buffer structure includes an AlN buffer layer and is formed by the sputtering method which can produce a dense buffer layer with high uniformity. Therefore, the AlN buffer layer can be formed conformably on a patterned surface of the substrate 101

As shown in FIG. 1A, the first electrode 104 can be located on the semiconductor stack 102. The first electrode 104 comprises a first pad 104*a* on the first region 111 and a first extending electrode 104*b* connecting to the first pad 104*a*. The first extending electrode 104*b* extends from the first pad 104*a*, across the first trench 103, and to the second region 112 of the semiconductor stack 102. The first pad 104*a* of the first electrode 104 can be located on the first type semiconductor layer 102*a* of the first region 111 via the recess L as shown in FIG. 1B. The first pad 104*a* may be a bonding pad for connecting to an external power source to introduce current into the semiconductor stack 102 to drive the LED 100. The first extending electrode 104*b* can be used to guide and evenly spread current between the first pad 104*a* and the semiconductor stack 102. The LED 100 in the first embodiment further comprises the second electrode 105, wherein the first electrode 104 electrically connects to the first type semiconductor layer 102*a* and the second electrode 105 electrically connects to the second type semiconductor layer 102*b*. The first electrode 104 and the second electrode 105 can be located on a same side of the semiconductor stack 102 to form a horizontal type LED as shown in FIGS. 1A-1D. In another embodiment, the first electrode 104 and the second electrode 105 can be located on opposite sides of the semiconductor stack 102 to form a vertical type LED.

In the first embodiment the second electrode 105 may comprise a second pad 105*a* on the second region 112 and a second extending electrode 105*b* connecting to the second pad 105*a*. The second extending electrode 105*b* extends from the second pad 105*a*, across the first trench 103, to the first region 111. More specifically, the LED 100 comprises a periphery P as shown in FIG. 1A. The shape of the semiconductor stack 102 in the present disclosure can be rectangle, and the periphery P of the semiconductor stack 102 comprises a first side P1, a second side P2 opposite to the first side P1, a third side P3 between the first side P1 and the second side P2, and a fourth side P4 opposite to the third side P3. The first side P1 and the second side P2 have the same length, which is a first length L1, and the third side P3 and the fourth side P4 have the same length, which is a second length L2. The first length L1 can be smaller than the second length L2. The first extending electrode 104*b* extends from the first pad 104*a* on the first region 111 toward the second side P2 and across the first trench 103. The second extending electrode 105*b* extends from the second pad 105*a* on the second region 112 toward the first side P1 and across the first trench 103. In present the embodiment, the first extending electrode 104*b* comprises a first end E1 away from the first pad 104*a*, and the second extending electrode 105*b* comprises a second end E2 away from the second pad 104*a*. The first end E1 and the second end E2 may respectively be disposed on the second region 112 and the first region 111 of the semiconductor stack 102. In the present embodiment, the first electrode 104 comprises two first extending electrodes 104*b* and the second electrode 105 comprises three second extending electrodes 105*b*, while the first extending electrodes 104*b* and the second extending electrodes are staggered. Two of the second extending electrodes 105*b* are closer to the periphery P of the semiconductor stack 102 than the first extending electrodes 104*b* are. However, the patterns of the first electrode 104 and the second electrode 105 are not limited. Materials of the first electrode 104 and the second electrode 105 include metal materials, such as chromium (Cr), titanium (Ti), tungsten (W), aluminum (Al), indium (In), tin (Sn), nickle (Ni), gold (Au), platinum (Pt), or an alloy of the above materials.

The LED 100 in the first embodiment further comprises a conductive layer 106 on the semiconductor stack 102. In the embodiment, the conductive layer 106 can be located between the semiconductor stack 102 and the second electrode 105. The conductive layer 106 can be discontinuous and divided into a first portion 1061 and a second portion 1062 by the first trench 103. In another embodiment, the conductive layer 106 can be continuous and the first trench 103 can be devoid of totally separating the first portion 1061 from the second portion 1062. In the present embodiment, the conductive layer 106 may comprise a periphery P' between the first pad 104*a* and the periphery P of the semiconductor stack 102. The area enclosed by the periphery P' of the conductive layer 106 is smaller than the area enclosed by the periphery P of the semiconductor stack 102. The conductive layer 106 can be used to evenly spread current between the second electrode 105 and the second type semiconductor layer 102*b*. The conductive layer 106 can be configured to form a low-resistance contact, for example ohmic contact, with the second type semiconductor layer 102*b*. The conductive layer 106 can include a single layer or multiple layers. The conductive layer 106 preferably comprises transparent material which is transparent to the light emitted from the semiconductor stack 102, and the transparent material of the conductive layer 106 may comprise transparent conductive oxide, such as indium tin oxide (ITO) or zinc oxide (ZnO). In addition, the LED 100 may comprise a passivation layer (not shown) covered on the top and the sidewall of the semiconductor stack 102 to protect the LED 100 from being damaged by mechanically handling or the corrosion by the environment. In one embodiment, the thicknesses of the conductive layer 106 can be about 300-1500 Å and the passivation layer can be about 500-1500 Å. When the substrate 101 comprises transparent material, such as sapphire or GaN, the LED 100 may further comprise a backside reflector (not shown) located under the substrate 101 in order to reflect the light emitting from the semiconductor stack 102 to the substrate 101 to enhance the light extraction efficiency.

In the first embodiment, the LED 100 can further comprise a current blocking layer 107 on the semiconductor stack 102. Specifically, the current blocking layer 107 can be located between the first electrode 104 and the semiconductor stack 102, and/or between the second electrode 105 and the semiconductor stack 102. More specifically, the current blocking layer 107 can be deposited between the conductive layer 106 and the second type semiconductor layer 102*b*. The current blocking layer 107 is discontinuous along the first electrode 104 or the second electrode 105 in the embodiment. More specifically, as shown in FIGS. 1A and 1B, the current blocking layer 107 comprises a first blocking layer 1071 substantially under the first electrode 104 and a second blocking layer 1072 substantially under the second electrode 105. As shown in FIGS. 1A-1C, the first blocking layer 1071 can further comprise multiple dot portions 1071*a* separated from one another. Those dot portions 1071*a* can substantially be located under the first pad 104*a* and/or under the first extending electrodes 104*b* as shown in FIGS. 1B-1C. As shown in FIGS. 1A and 1C, some dot portions 1071*a* can be between the first extending electrode 104*b* and the top surface 101*a* of the substrate 101, which is exposed by the first trench 103. The dot portions 1071*a* of the first blocking layer 1071 which is on the first trench 103 physically contacts the top surface 101*a* of the substrate 101 and cover a portion of the semiconductor stack 102 near the first trench 103 as shown in FIG. 1C. The dot portions 1071*a* of the current blocking layer 107 can help to spread the current in the LED 100. As shown in FIGS. 1A and 1D, the second blocking layer 1072 can be continuous and comprise a blocking width in a direction parallel with the first side P1, and the blocking width may be various along the second extending electrode 105*b*. For example, in the embodiment, the blocking width of one portion of the second blocking layer 1072 corresponding to the position of the first trench 103 is larger than the blocking width of the other portions of the second blocking layer 1072. Further, in the embodiment, the blocking width may be larger than the width of the second extending electrode 104*b*. The current blocking layer 107 comprises an insulating material comprising aluminum oxide ($AlO_x$), silicon oxide ($SiO_x$), silicon oxynitride ($SiO_xN_y$), silicon nitride ($Si_xN_y$), epoxy, polyimide, perfluorocyclobutane, benzocyclobutene (BCB) or silicone. Preferably, the current blocking layer 107 may be substantially transparent to the light emitted from the semiconductor stack 102.

The first trench 103 may be formed by penetrating the semiconductor stack 102, including the second type semiconductor layer 102*b*, the active layer 102*c* and the first type semiconductor layer 102*a*, to expose the top surface 101*a* of the substrate 101. In the embodiment, the light emitted from a sidewall(s) of the first region 111 and/or the second region 112 can be reflected by the top surface 101*a* which is exposed by the first trench 103, and therefore the light extraction efficiency of the LED 100 can be enhanced. In the embodiment, as shown in FIGS. 1B and 1D, the first trench 103 comprises a side wall B connecting to the top surface 101*a* of the substrate 101. An angle formed between the side wall B of the first trench 103 and the top surface 101*a* of the substrate 101 can be about 40-80 degrees in the first embodiment. The first trench 103 could be formed by etching the semiconductor stack 102 such as wet etching or dry etching method to remove part of the semiconductor stack 102. In one embodiment, the first trench 103 can be filled with an insulating material, such as $SiO_2$ or epoxy.

FIG. 1B shows a cross-section view of the LED 100 along the line A-A' in FIG. 1A. As shown in FIG. 1B, the first region 111 and the second region 112 are separated by the first trench 103. As shown in FIGS. 1A and 1B, one of the second extending electrodes 105*b* directly pointed to the first pad 104*a* is devoid of crossing over the first trench 103. However, in another embodiment, all of the second extending electrodes 105*b* may be across the first trench 103 and reach the first region 111 of the semiconductor stack 102. FIG. 1C shows a cross-section view of the LED 100 along the line B-B' in FIG. 1A. As shown in FIGS. 1A and 1C, multiple dot portions 1071*a* can be deposited on the first type semiconductor layer 102*a*, and one of the dot portions 1071*a* can be located on the first trench 103. The first extending electrode 104*b* is across the first trench 103, covers the current blocking layer 107, and electrically connects to the first type semiconductor layer 102*a* of the first region 111 and the first type semiconductor layer 102*a* of the second region 112. FIG. 1D shows a cross-section view of the LED 100 along the line C-C' in FIG. 1A. As shown in FIG. 1D, the second blocking layer 1072 is on the semiconductor stack 102 along the line C-C' and contacts the top surface 101*a* of the substrate 101 where exposed by the first trench 103. The conductive layer 106 may be deposited on the current blocking layer 107 and divided into the first portion 1061 and the second portion 1062. The first portion 1061 of the conductive layer 106 can be substantially located on the first region 111, while the second portion 1062 can substantially be located on the second region 112. The second extending electrode 105*b* electrically connects the first portion 1061 and the second portion 1062 of the conductive layer 106. The current blocking layer 107 can cover the side wall B of the first trench 103 to protect the semiconductor stack 102 as well as electrically insulate the second extending electrode 105*b* from the first type semiconductor layer 102*a*.

Figure 2A:
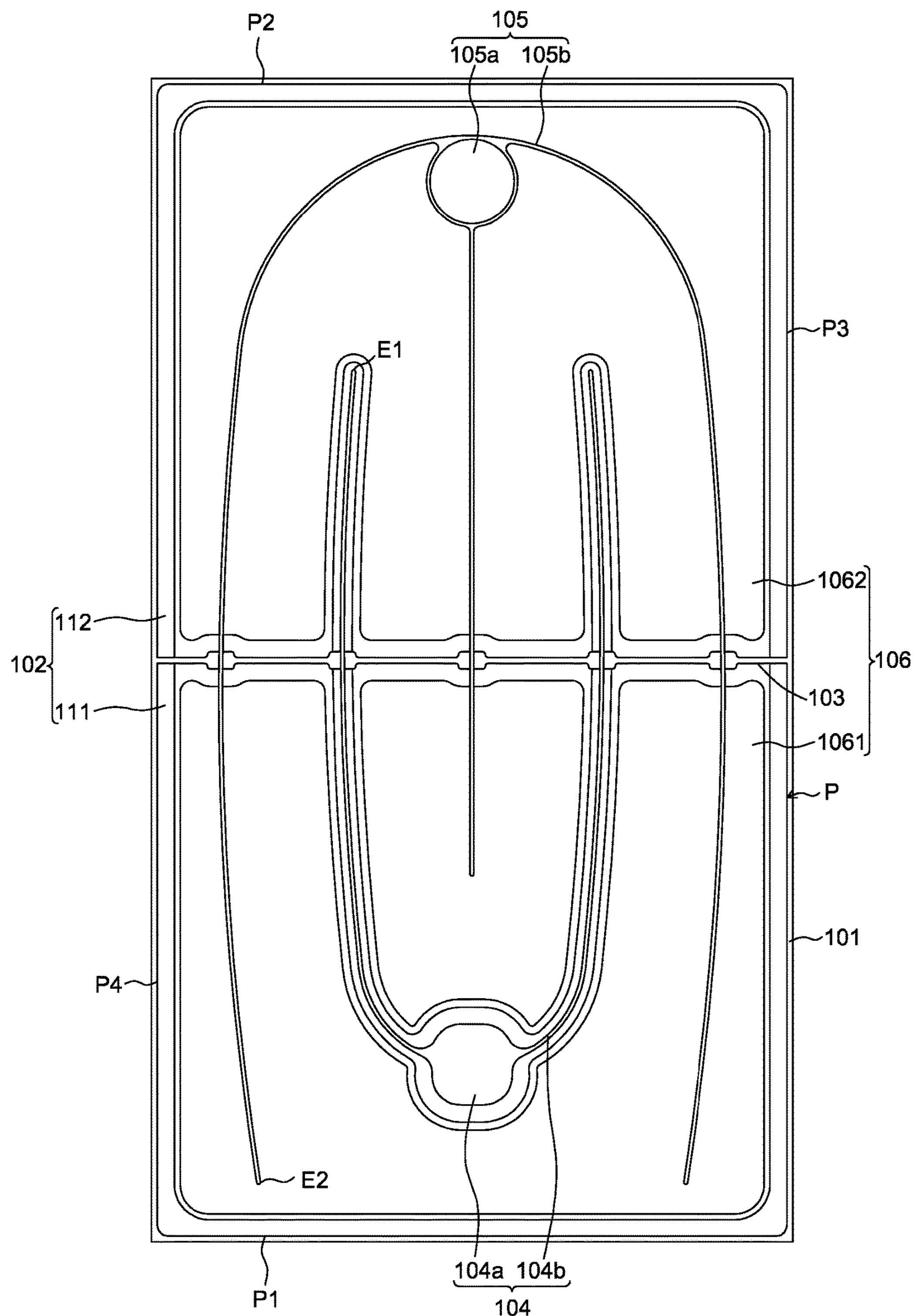
FIG. 2A shows a schematic top view of a light-emitting device in accordance with a second embodiment of the present disclosure.
Figure 2B:
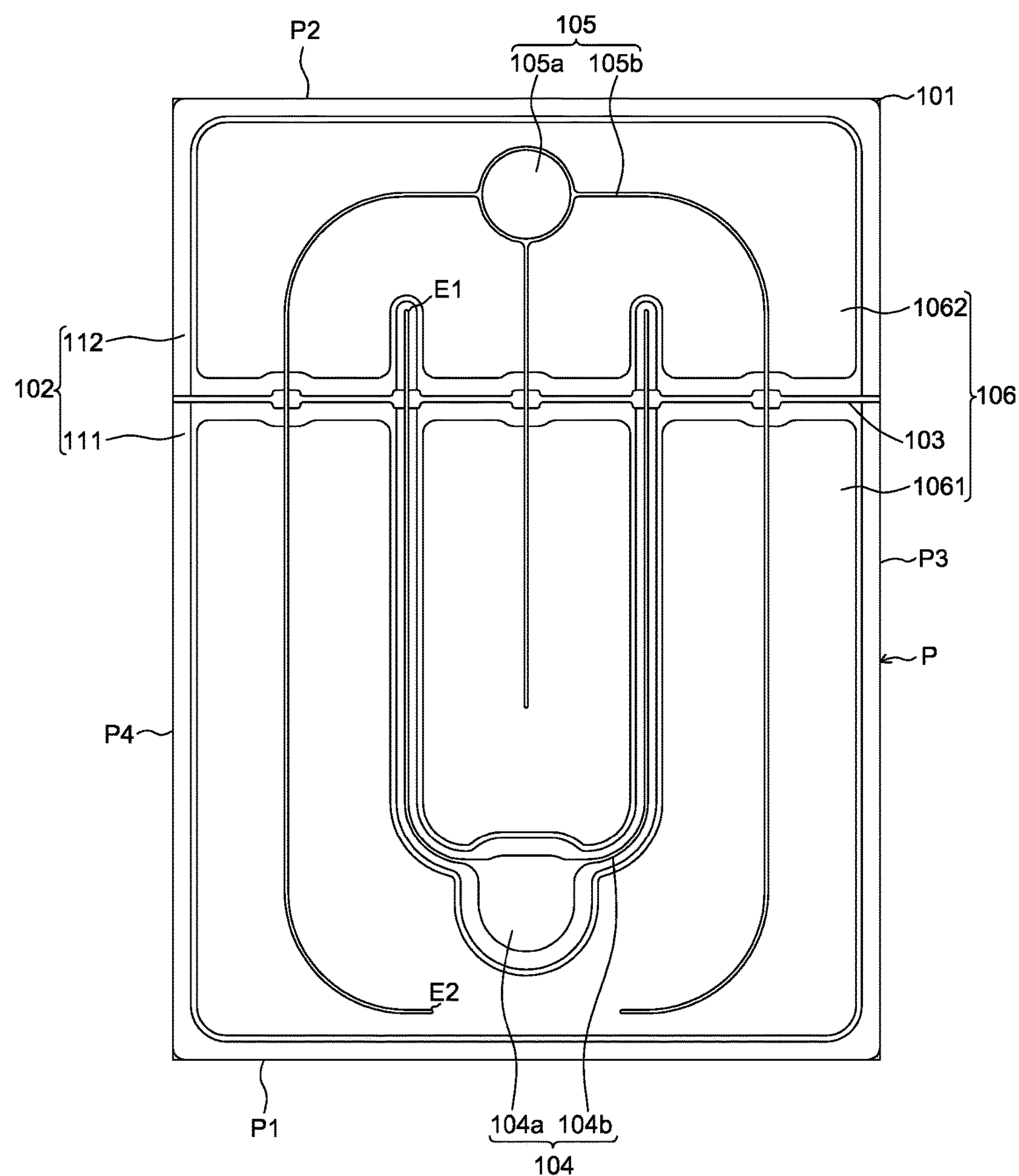
FIG. 2B shows a schematic top view of a light-emitting device in accordance with a third embodiment of the present disclosure.

In the present disclosure, the first trench 103 can be located between the first side P1 and the second side P2, or between the first pad 104*a* and the second pad 105*a*. In the embodiment shown in FIG. 1A, the first pad 104*a* is closer to the first trench 103 than the second pad 105*a* is, and a surface area of the first region 111 is different from that of the second region 112 from the top view of the light-emitting device 100. In the second embodiment as shown in FIG. 2A, a distance between the first pad 104*a* and the first trench 103 is substantially the same as a distance between the second pad 105*a* and the first trench 103. In the third embodiment as shown in FIG. 2B, the second pad 105*a* is closer to the first trench 103 than the first pad 104*a* is. According to the present disclosure, the current crowding effect near one pad on the semiconductor stack 102 can be reduced by changing the location of first trench 103, for example disposing the first trench 103 near the other pad on the semiconductor stack 102, and vice versa. The first trench 103 comprises a trench width in a direction from the first pad 104*a* toward the second pad 105*a*, or in a direction along the third side P3. The trench width is uneven along an extending direction of the first trench 103, which is parallel to the first side P1 in the first embodiment shown in FIG. 1A. The first trench 103 comprises a first trench width W1 and a second trench width W2 different from the first width W1. The regions of the first trench 103 where are covered by the first electrode 104 or the second electrode 105 comprise the first trench width W1, while the other regions of the first trench 103 devoid of being capped by the electrode 104, 105 comprise the second trench width W2. In the first embodiment, the first trench width W1 may be larger than the second trench width W2. In another embodiment, the first trench 103 comprises an even trench width along the extending direction of the first trench 103, which means the first trench width W1 may be equal to the second trench width W2. Preferably, a ratio of the second trench width W2 to the second length L2 of the third side P3 is about 0.02-0.06 for better current spreading. When the first trench 103 being applied in a narrow shape LED 100 according to the present disclosure, for example, the semiconductor stack 102 with a ratio of the first length L1 to the second length L2 not more than 0.6, the power of the LED 100 can be further increased.

Figure 3A:
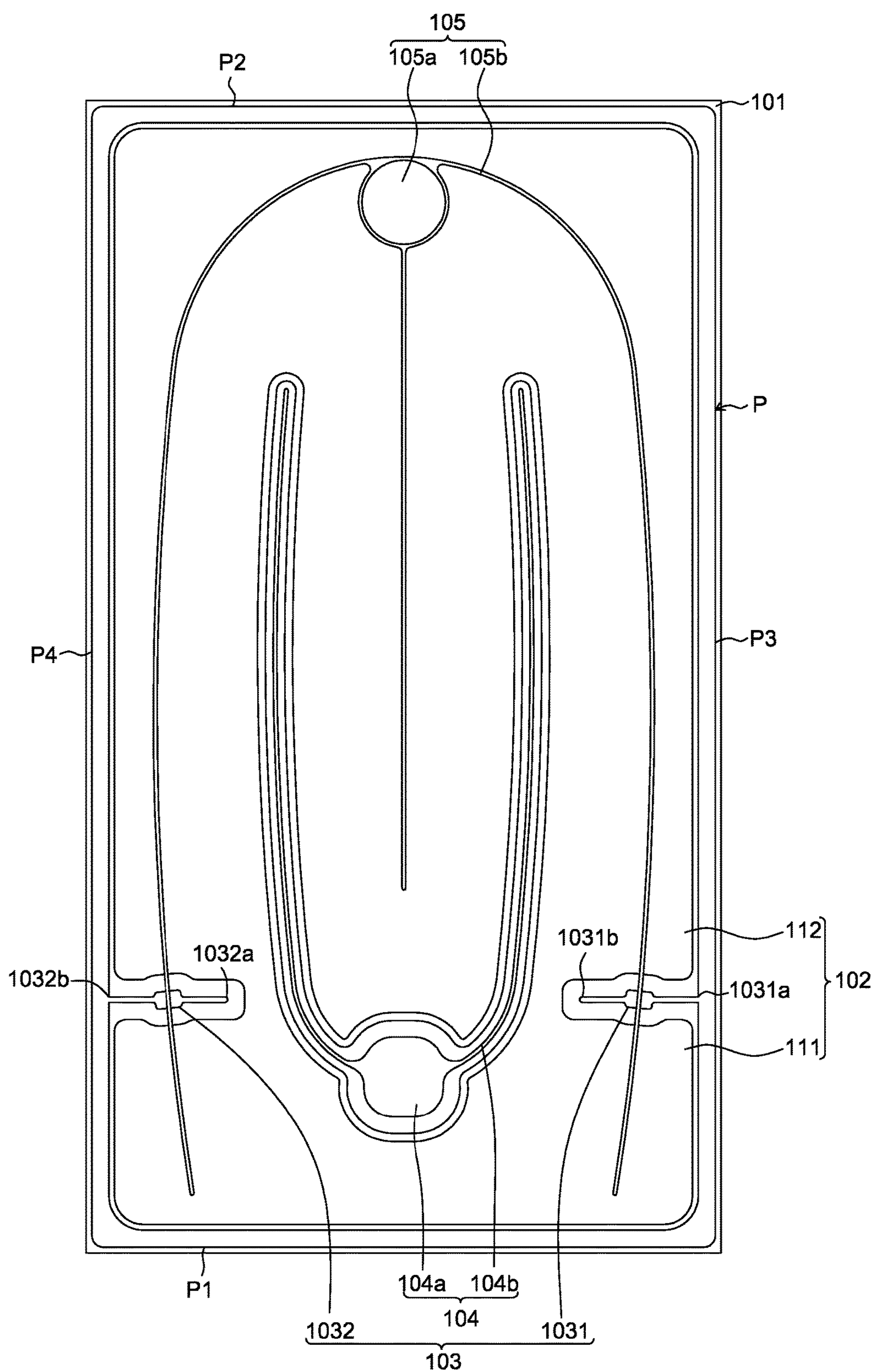
FIG. 3A shows a schematic top view of a light-emitting device in accordance with a fourth embodiment of the present disclosure.

In the first embodiment the first trench 103 comprises a first end 103*a* and a second end 103*b* opposite to the first end 103*a*. The first trench 103 connects to the periphery P of the semiconductor stack 102 by the first end 103*a* and the second end 103*b*. More specifically, the first end 103*a* and the second end 103*b* respectively connect to the third side P3 and the fourth side P4. In another embodiment, only one of the first end 103*a* and second end 103*b* of the first trench 103 connects to the periphery P of the semiconductor stack 102. In another embodiment, both of the first end 103*a* and second end 103*b* may be devoid of connecting to the periphery P of the semiconductor stack 102. The first trench 103 may comprise various patterns, such as the first trench 103 totally separates the first region 111 from the second region 112, or partially separates the first region 111 and the second region 112 and the two regions still connect to each other at some portion. FIG. 3A shows a fourth embodiment of the present disclosure and the first trench 103 in the embodiment is discontinuous and comprises a first part 1031 and a second part 1032 separated from the first part 1031. The first part 1031 comprises a first end 1031*a* and a second end 1031*b* separated from the first end 1031*a*. The second part 1032 comprises a third end 1032*a* and a fourth end 1032*b* separated from the third end 1032*a*. The first end 1031*a*, the second end 1031*b*, the third end 1032*a* and the fourth end 1032*b* may be devoid of connecting to the periphery P of the semiconductor stack 102. The second end 1031*b* and the third end 1032*a* are closer to the first pad 104*a* than the first end 1031*a* and a fourth end 1032*b* are. Therefore, the first region 111 and the second region 112 connect to each other via an area of the semiconductor stack 102 between the first end 1031*a* and the third side P3, an area of the semiconductor stack 102 between the second end 1031*b* and the third end 1032*a*, and an area of the semiconductor stack 102 between the fourth end 1032*b* and the fourth side P4. The second extending electrode 105*b* extends from the second pad 105*a* on the second region 112 and is across the first trench 103 to cover the first region 111.

Figure 3B:
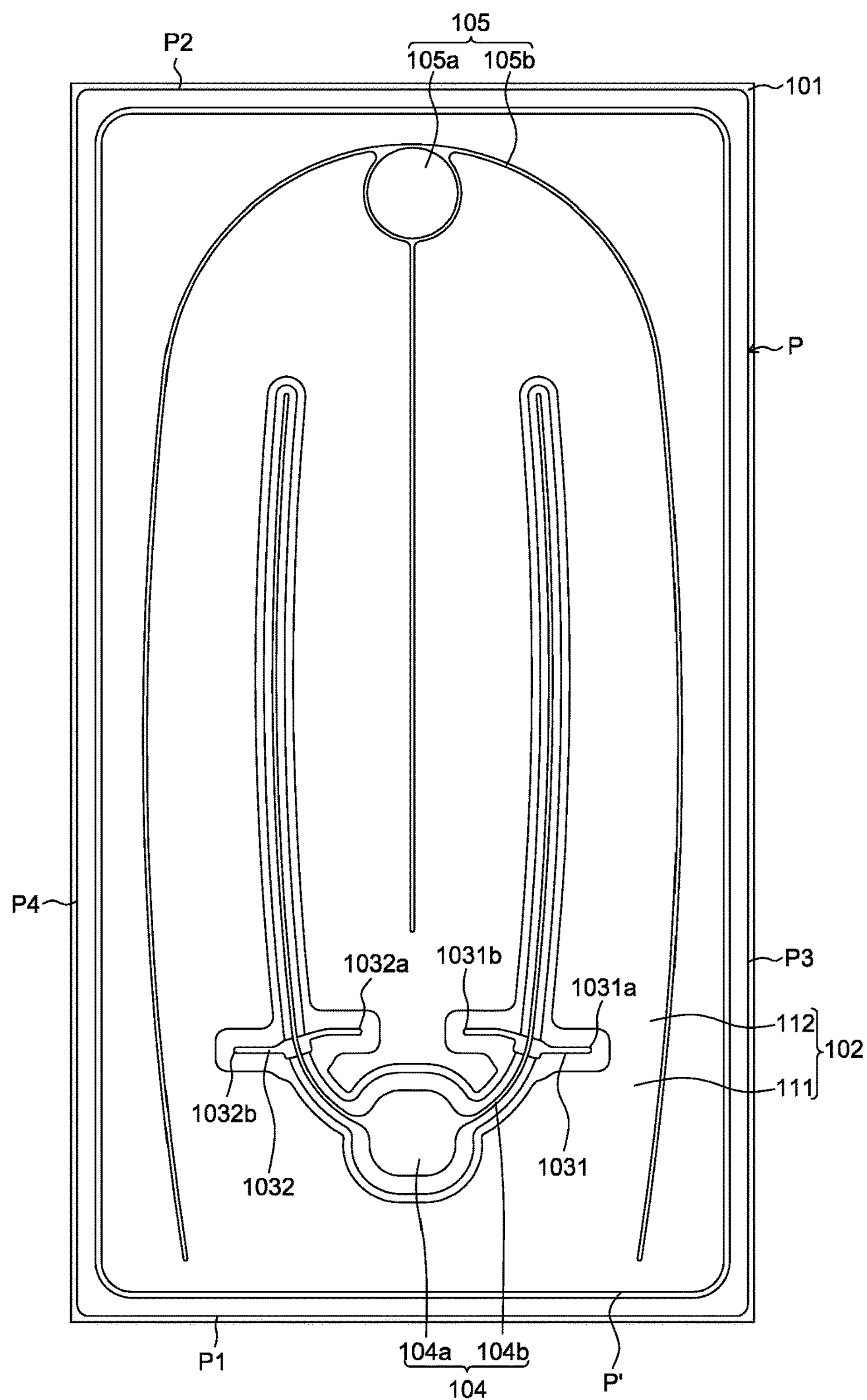
FIG. 3B shows a schematic top view of a light-emitting device in accordance with a fifth embodiment of the present disclosure.

FIG. 3B shows a fifth embodiment of the present disclosure. The first trench 103 is discontinuous and comprises a first part 1031 and a second part 1032 separated from the first part 1031. The structure of the present embodiment is similar with the structure shown in the fourth embodiment. However, in the present embodiment, the first end 1031*a* and the fourth end 1032*b* are between the first extending electrode 104*b* and the second extending electrode 105*b*. The first extending electrode 104*b* extends from the first pad 104*a* on the first region 111 and is across the first trench 103 to cover the second region 112.

Figure 3C:
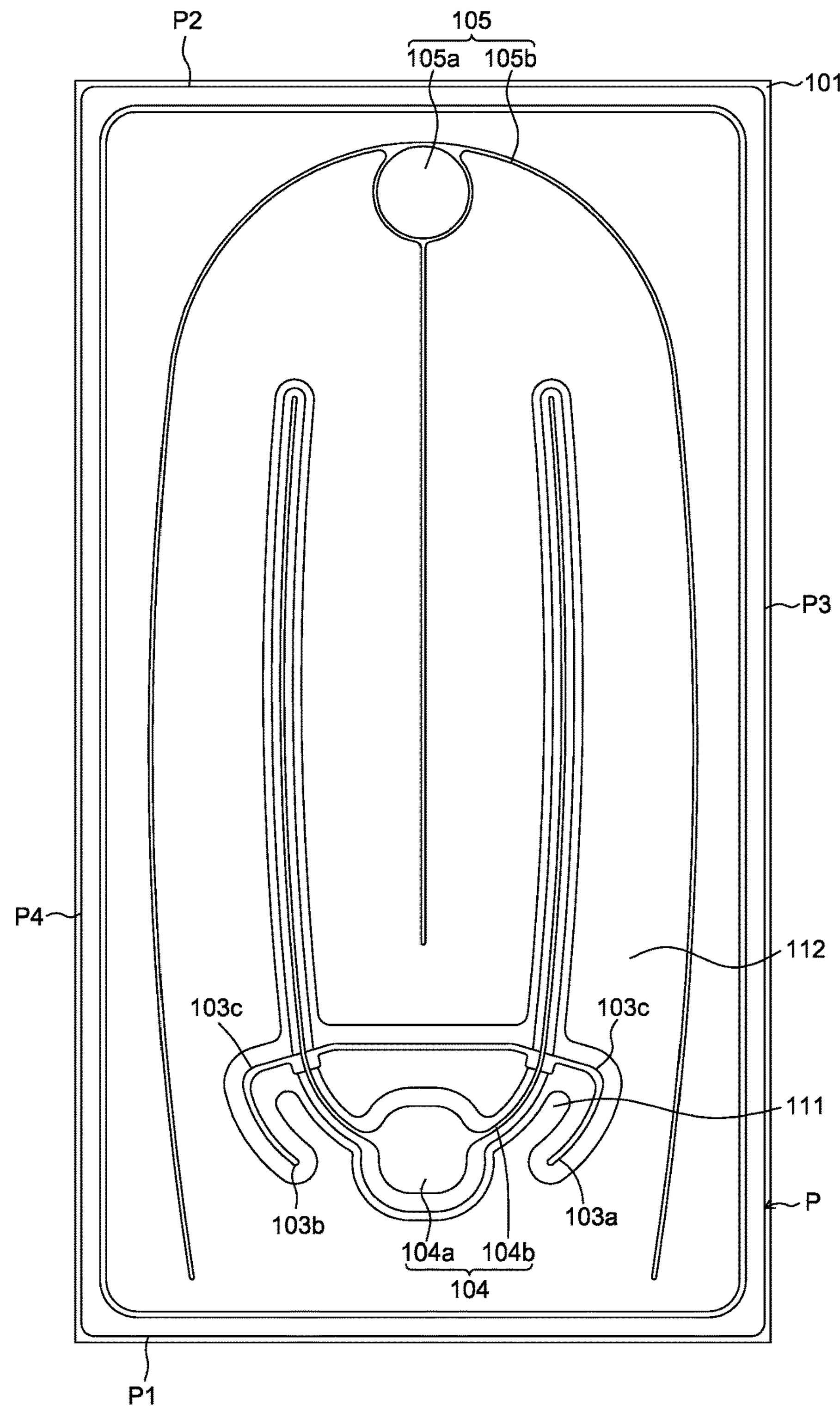
FIG. 3C shows a schematic top view of a light-emitting device in accordance with a sixth embodiment of the present disclosure.

FIG. 3C shows a sixth embodiment of the disclosure. The first trench 103 comprises a first trench end 103*a* and a second trench end 103*b*, and two bends 103*c* between the first trench end 103*a* and the second trench end 103*b*. The first trench end 103*a* and a second trench end 103*b* may be devoid of connecting to the periphery P. The first trench 103 surrounds the first pad 104*a*, and a virtual opening is between the first trench end 103*a* and a second trench end 103*b*. The first trench end 103*a* and the second trench end 103*b* can be located between the first extending electrode 104*b* and the second extending electrode 105*b*. The bends 103*c* can be located between the first trench end 103*a* and the second extending electrode 105*b*, and between the second trench end 103*b* and the second extending electrode 105*b*. In the embodiment, the bends 103*c* may be blunt which can avoid incurring any electrostatic discharge issue. However, in another embodiment, the first trench 103 may comprise a sharp bend 103*c*.

Figure 4A:
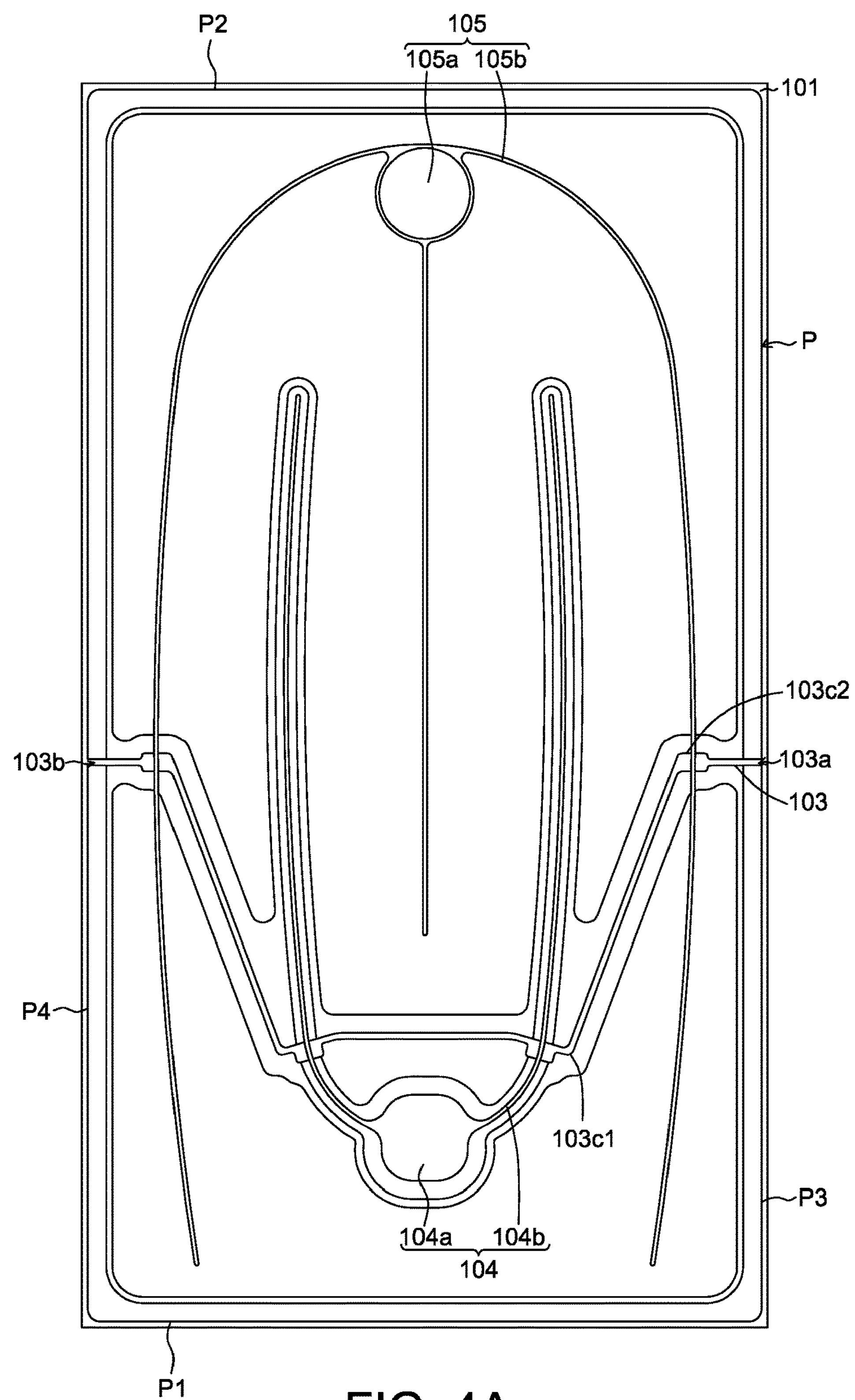
FIG. 4A shows a schematic top view of a light-emitting device in accordance with a seventh embodiment of the present disclosure.
Figure 4B:
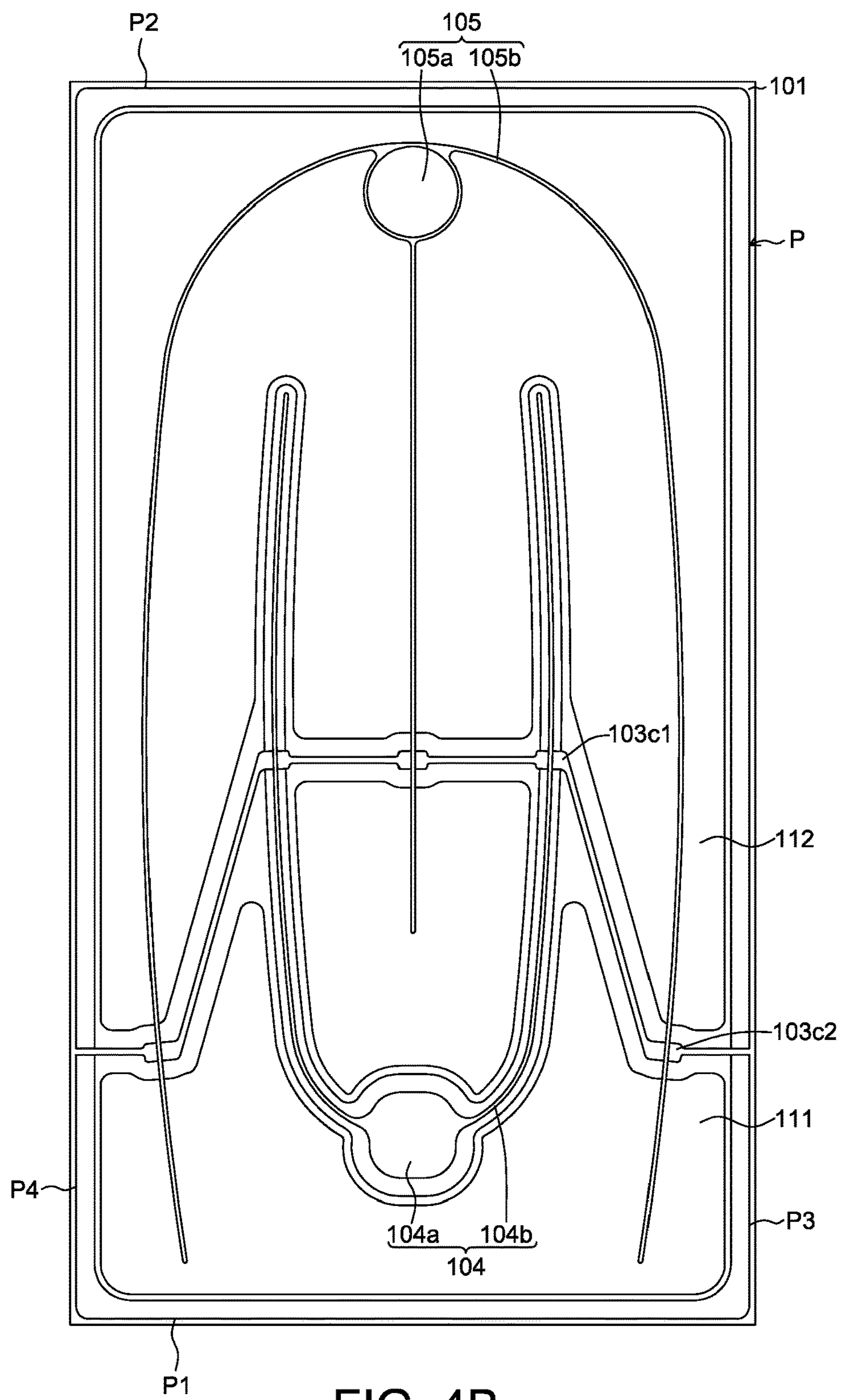
FIG. 4B shows a schematic top view of a light-emitting device in accordance with an eighth embodiment of the present disclosure.

FIG. 4A shows a seventh embodiment of the disclosure. The present embodiment is similar to the structure shown in FIG. 3C, but the patterns of the first trench 103 disclosed in the two embodiments are different. As shown in FIG. 4A, the first trench 103 comprises a first trench end 103*a* connecting to the third side P3 and a second trench end 103*b* connecting to the fourth side P4. The first trench 103 comprises a first bend 103*c*1 and a second bend 103*c*2 between the first trench end 103*a* and the second trench end 103*b*. The first extending electrode 104*b* may be across the first trench 103 and deposited near the first bend 103*c*1, and the second extending electrode 105*b* may be across the first trench 103 and deposited near the second bend 103*c*2. The distance between the first bend 103*c*1 and the first pad 104*a* is different from the distance between the second bend 103*c*2 and the first pad 104*a*. The first trench 103 divides the semiconductor stack 102 into the first region 111 and the second region 112 physically separated from the first region 111, and both of the regions 111, 112 have irregular shapes. In the present embodiment, the amounts of the first bend 103c1 and the second bend 103c2 are two, and each of the first bend 103c1 is closer to the first pad 104a than each of the second bend 103c2 to the first pad 104a. The first bend 103c1 and the second bend 103c2 are closer to the first pad 104a comparing with the second pad 105a. FIG. 4B shows an eighth embodiment of the present disclosure. Similar with the seventh embodiment, the first trench 103 comprises a first bend 103c1 and a second bend 103c2 between the first trench end 103a and the second trench end 103b. However, in the present embodiment, the first bend 103c1 is farer to the first pad 104a than the second bend 103c2 to the first pad 104a.

Figure 5A:
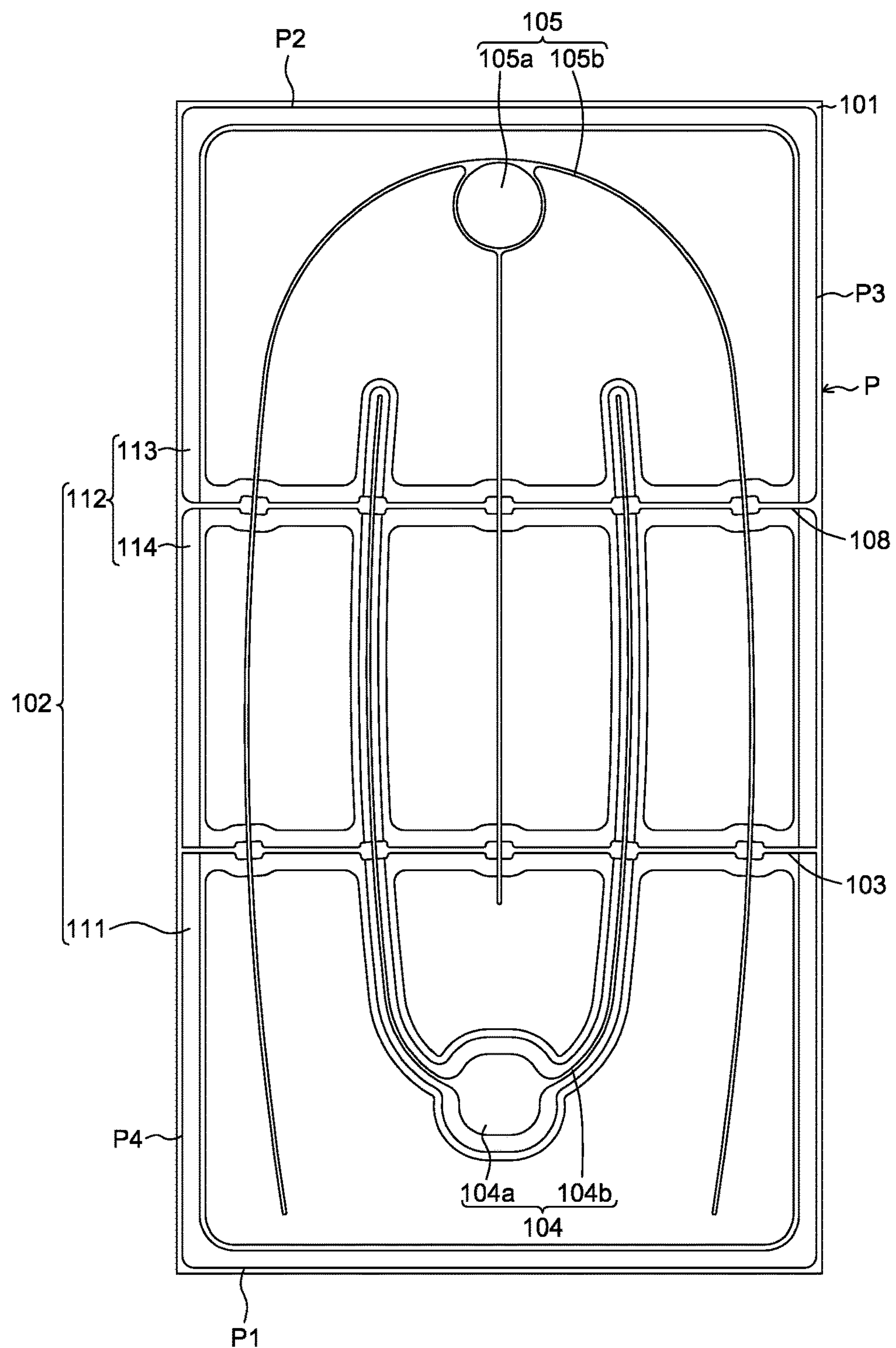
FIG. 5A shows a schematic top view of a light-emitting device in accordance with a ninth embodiment of the present disclosure.
Figure 5B:
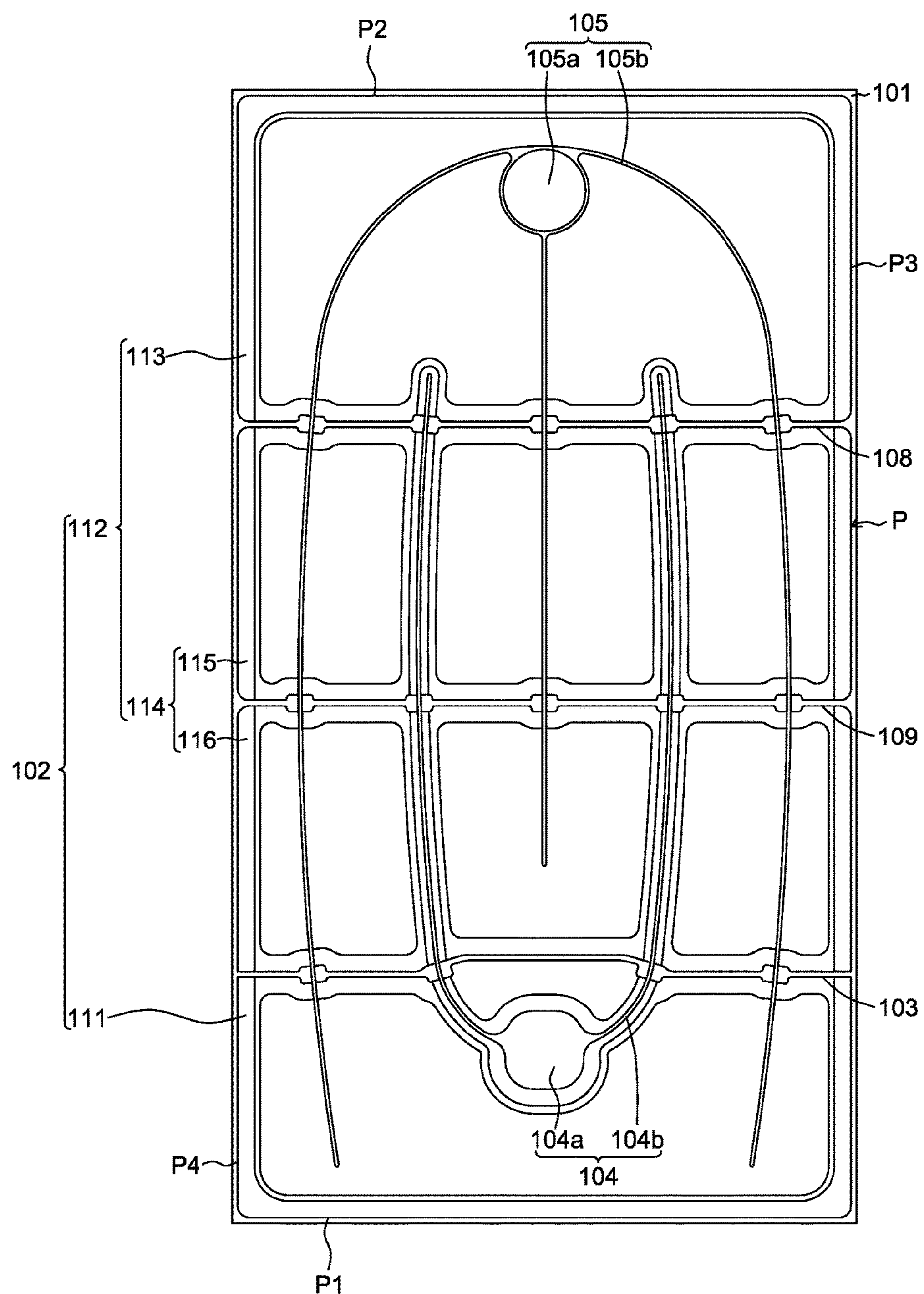
FIG. 5B shows a schematic top view of a light-emitting device in accordance with a tenth embodiment of the present disclosure.

FIG. 5A shows a ninth embodiment of the present disclosure, wherein the LED 100 further comprises a second trench 108. The structures of the second trench 108 can be the same or similar with the first trench 103 shown in the previous embodiments. More specifically, the first trench 103 separates the semiconductor stack 101 into a first region 111 and a second region 112, and the second trench 108 separates the second region 112 of the semiconductor stack 102 into the third region 113 away from the first region 111 and the fourth region 114 closer to the first region 111. The second pad 105a can be located on the third region 113 while the first pad 104a can be located on the first region 111. In the present embodiment, the first trench 103 and the second trench 108 separates the semiconductor stack 102 into the first region 111, the third region 113 and the fourth region 114 with equal length in a direction parallel with the third side P3. In another embodiment, the first region 111, the third region 113 and the fourth region 114 comprises different length in a direction parallel with the third sides P3. FIG. 5B shows a tenth embodiment of the disclosure. The LED 100 is similar to the ninth embodiment but further comprises a third trench 109 between the first trench 103 and the second trench 108. The third trench 109 separates the fourth region 114 into a fifth region 115 away from the first region 111 and a sixth region 116 closer to the first region 111. The first region 111, the third region 113, the fifth region 115 and the sixth region 116 can comprise the same or different length in a direction parallel with the third sides P3.

It should be noted that the proposed various embodiments are for explanation but not for the purpose to limit the scope of the disclosure. Any possible modifications without departing from the spirit of the disclosure may be made and should be covered by the disclosure. The similar or same elements or the elements with the same reference numeral in different embodiments have identical chemical or physical characters. Besides, the elements shown in different embodiments described above could be combined or replaced with one another in proper situation. The connecting relationship of specific element particularly described in one embodiment could also be applied in another embodiment, and the subject matter which comprises the elements in different embodiments all fall within the scope of the following claims and their equivalents.

What is claimed is:

1. A light-emitting device, comprising:

a substrate;

a semiconductor stack on the substrate comprising a first region and a second region;

a first trench extending from the semiconductor stack to the substrate to expose a surface of the substrate and separating the first region from the second region;

a first electrode comprising a first pad on the first region and a first extending electrode connecting to the first pad, wherein the first extending electrode is across the first trench; and a current blocking layer on the semiconductor stack and comprising a various width.

2. The light-emitting device of claim 1, further comprising a second electrode having a second pad on the second region.

3. The light-emitting device of claim 2, wherein the second electrode further comprises a second extending electrode connecting to the second pad, and the second extending electrode is across the first trench.

4. The light-emitting device of claim 1, wherein the current blocking layer comprises multiple dot portions separated from one another.

5. The light-emitting device of claim 3, wherein the current blocking layer is between the first extending electrode and the substrate, or between the second extending electrode and the substrate.

6. The light-emitting device of claim 4, wherein one of the multiple dot portions is located on the first trench.

7. The light-emitting device of claim 1, wherein a blocking width of one portion of the current blocking layer corresponding to the position of the first trench is different from a blocking width of the other portions of the current blocking layer.

8. The light-emitting device of claim 1, wherein a blocking width of one portion of the current blocking layer corresponding to the position of the first trench is larger than a blocking width of the other portions of the current blocking layer.

9. The light-emitting device of claim 1, further comprising a conductive layer on the semiconductor stack.

10. The light-emitting device of claim 1, wherein the conductive layer comprises a first portion and a second portion separated from the first portion, and the first portion and the second portion are substantially located on the first region and the second region of the semiconductor stack respectively.

11. A light-emitting device, comprising:

a substrate;

a semiconductor stack on the substrate comprising a first region and a second region;

a first trench extending from the semiconductor stack to the substrate to expose a surface of the substrate, and located between the first region and the second region, wherein a trench width along an extending direction of the first trench is uneven; and a first electrode comprising a first pad on the first region and a first extending electrode connecting to the first pad, wherein the first extending electrode is across the first trench.

12. The light-emitting device of claim 11, wherein one region of the first trench covered by the first electrode comprises a first width, and the other regions of the first trench devoid of being covered by the first electrode comprises a second width smaller than the first width.

13. The light-emitting device of claim 11, wherein the first trench is discontinuous and comprises a first part and a second part separated from the first part.

14. The light-emitting device of claim 13, wherein the first part and the second part are devoid of connecting to a periphery of the semiconductor stack.

15. The light-emitting device of claim 13, wherein the first region of the semiconductor stack physically connects to the second region of the semiconductor stack.

16. The light-emitting device of claim 11, wherein a shape of the semiconductor stack is rectangle comprising a first side with a first length and a second side with a second length, and a ratio of the first length to the second length is not more than 0.6.

17. The light-emitting device of claim 11, wherein an angle formed between a side wall of the first trench and a top surface of the substrate is 40-80 degrees.

18. The light-emitting device of claim 11, wherein the first electrode further comprises a second extending electrode connecting to the first pad, and the second extending electrode is devoid of crossing over the first trench.

19. The light-emitting device of claim 11, wherein the first trench comprises a bend, and the first extending electrode is deposited near the first bend.

20. The light-emitting device of claim 11, further comprising a current blocking layer having a various width on the semiconductor stack.

* * * * *